(12) United States Patent
Moghadam et al.

(10) Patent No.: US 7,399,388 B2
(45) Date of Patent: Jul. 15, 2008

(54) SEQUENTIAL GAS FLOW OXIDE DEPOSITION TECHNIQUE

(75) Inventors: Farhad K. Moghadam, Saratoga, CA (US); Michael S. Cox, Davenport, CA (US); Padmanabhan Krishnaraj, San Francisco, CA (US); Thanh N. Pham, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 241 days.

(21) Appl. No.: 10/627,228

(22) Filed: Jul. 25, 2003

(65) Prior Publication Data

US 2005/0019494 A1    Jan. 27, 2005

(51) Int. Cl.
C23C 14/34    (2006.01)
C23C 16/00    (2006.01)

(52) U.S. Cl. .............. 204/192.37; 427/255.37; 427/574; 204/192.3

(58) Field of Classification Search ............ 204/192.23, 204/192.3, 192.37; 427/255.37, 574
See application file for complete search history.

(56) References Cited

U.S. PATENT DOCUMENTS

| | | | | |
|---|---|---|---|---|
| 4,732,761 | A | * | 3/1988 | Machida et al. ............. 438/695 |
| 5,483,919 | A | | 1/1996 | Yokoyama et al. |
| 5,521,126 | A | | 5/1996 | Okamura et al. ............. 438/789 |
| 5,571,576 | A | * | 11/1996 | Qian et al. ................... 427/574 |
| 5,916,365 | A | | 6/1999 | Sherman ...................... 117/42 |
| 6,025,627 | A | | 2/2000 | Forbes et al. ................ 257/321 |
| 6,200,893 | B1 | | 3/2001 | Sneh ........................... 438/685 |
| 6,305,314 | B1 | | 10/2001 | Sneh et al. ............... 118/723 R |
| 6,342,277 | B1 | | 1/2002 | Sherman ..................... 427/562 |
| 6,355,561 | B1 | | 3/2002 | Sandhu et al. .............. 438/676 |

(Continued)

FOREIGN PATENT DOCUMENTS

EP    442 490 A1    8/1991

(Continued)

OTHER PUBLICATIONS

"Atomic Layer Deposition" by Physical Inorganic Chemistry, Institute of Applied Synthetic Chemistry, downloaded from website http://www.ias.tuwien.ac.at/research/fghh/research/pic_research_ald.html on Jul. 23, 2002.

(Continued)

*Primary Examiner*—Rodney G. McDonald
(74) *Attorney, Agent, or Firm*—Townsend and Townsend and Crew LLP

(57) ABSTRACT

A method of depositing a silica glass insulating film over a substrate. In one embodiment the method comprises exposing the substrate to a silicon-containing reactant introduced into a chamber in which the substrate is disposed such that one or more layers of the silicon-containing reactant are adsorbed onto the substrate; purging or evacuating the chamber of the silicon-containing reactant; converting the silicon-containing reactant into a silica glass insulating compound by exposing the substrate to oxygen radicals formed from a second reactant while biasing the substrate to promote a sputtering effect, wherein an average atomic mass of all atomic constituents in the second reactant is less than or equal to an average atomic mass of oxygen; and repeating the exposing, purging/evacuating and exposing sequence a plurality of times until a desired film thickness is reached.

28 Claims, 3 Drawing Sheets

U.S. PATENT DOCUMENTS

| | | | |
|---|---|---|---|
| 6,406,924 B1 * | 6/2002 | Grimbergen et al. | 438/9 |
| 6,428,859 B1 * | 8/2002 | Chiang et al. | 427/457 |
| 6,511,539 B1 | 1/2003 | Raaijmakers | |
| 6,569,501 B2 | 5/2003 | Chiang et al. | |
| 6,596,654 B1 | 7/2003 | Bayman et al. | 438/788 |
| 6,616,986 B2 | 9/2003 | Sherman | |
| 6,630,201 B2 | 10/2003 | Chiang et al. | |
| 2001/0002280 A1 | 5/2001 | Sneh | 427/255.28 |
| 2001/0028924 A1 | 10/2001 | Sherman | 427/255.28 |
| 2001/0031562 A1 | 10/2001 | Raaijmakers et al. | 438/770 |
| 2001/0041250 A1 | 11/2001 | Werkhoven et al. | 428/212 |
| 2002/0031618 A1 | 3/2002 | Sherman | 427/569 |
| 2002/0197402 A1 * | 12/2002 | Chiang et al. | 427/255.39 |
| 2003/0232511 A1 | 12/2003 | Metzner et al. | |

FOREIGN PATENT DOCUMENTS

| | | |
|---|---|---|
| EP | 526 779 B1 | 2/1993 |
| WO | WO 00/54320 A1 | 9/2000 |
| WO | WO 00/61833 A1 | 10/2000 |
| WO | WO 01/40541 A1 | 6/2001 |
| WO | WO 01/66832 A2 | 9/2001 |

OTHER PUBLICATIONS

George et al., "Atomic layer controlled deposition of $SiO_2$ and $Al_2O_3$ using ABAB . . . binary reaction sequence chemistry," *Applied Surface Science*, 82/83:460-467 (1994).

George et al., "Surface Chemistry for Atomic Layer Growth," *J. Phys. Chem.*, 100(31):13121-13131 (1996).

Klaus et al., "Atomic Layer Deposition of $SiO_2$ Using Catalyzed and Uncatalyzed Self-Limiting Surface Reactions," *Surface Review and Letters*, 6(3/4):435-448 (1999).

Klaus et al., "Atomic layer controlled growth of $SiO_2$ films using binary reaction sequence chemistry," *Appl. Phys. Lett.*, 70(9):1092-1094 (1997).

Morishita et al., "New substances for atomic-layer deposition of silicon dioxide," *J. Non-Crystalline Solids*, 187:66-69 (1995).

Wise et al., "Diethyldiethoxysilane as a New Precursor for $SiO_2$ Growth on Silicon," from *Gas-Phase and SurfaceChemistry in electronic Materials Processing*, Mountziaris et al., eds., from Symposium held Nov. 29, 1993 thru Dec. 2, 1993 in Boston Massachusetts, pp. 37-43.

Yamaguchi et al., "Atomic-layer chemical-vapor-deposition of silicon dioxide films with an extremely low hydrogen content," *Applied Surface Science*, 130-132:202-207 (1998).

* cited by examiner

SEQUENTIAL GAS FLOW OXIDE DEPOSITION TECHNIQUE

BACKGROUND OF THE INVENTION

One of the primary steps in the fabrication of modern semiconductor devices is the formation of an insulation film on a semiconductor substrate. Such insulation films are used for a variety of purposes including, among others, separating adjacent conductive layers (e.g., an intermetal dielectric (IMD) layer separates adjacent metal lines while a premetal dielectric (PMD) layer separates metal layer one from the conductive substrate) and separating adjacent active regions of the substrate (e.g., as part of a shallow trench isolation (STI) structure).

For applications such as the deposition of IMD or PMD layers in an integrated circuit or the formation of STI structures, one important physical property of the insulation film is its ability to completely fill gaps between adjacent structures without leaving voids within the gap. This property is referred to as the film's gapfill capability. Gaps that may require filling include spaces between adjacent conductive lines, spaces formed by an etched trench or the like.

As semiconductor device geometries have decreased in size over the years, the ratio of the height of such gaps to their width, the so-called "aspect ratio," has dramatically increased. Gaps having a combination of a high aspect ratio and a small width present a challenge for semiconductor manufacturers to fill completely. In short, the challenge usually is to prevent the film from forming in a manner that closes off the gap before it is filled. Failure to fill a gap completely results in the formation of a void in the deposited layer, which may adversely affect device operation.

FIG. 1 is a simplified cross-sectional view of a partially completed integrated circuit 10 that can help illustrate the gapfill issue. Partially formed integrated circuit 10 is formed over a silicon substrate 12 that includes a plurality of shallow trench isolation structures 14. As shown in FIG. 1, integrated circuit 10 has a relatively densely packed area 16 where densely packed active devices (e.g., transistors are formed) and a relatively isolated area 18 (also referred to as an "open area") where an active device may be separated from another active device by a distance that is an order of magnitude more than the spacing between devices in the densely packed area.

A typical shallow trench isolation structure is created by first forming a thin pad oxide layer 20 over the surface of silicon substrate 12 and then form a silicon nitride layer 22 over pad oxide layer 20. The nitride and oxide layers are then patterned using standard photolithography techniques and trenches 24 are etched through the nitride/oxide stack into silicon substrate 12. Trenches 24 are then filled with an insulating material such as silicon dioxide using a deposition process that has good gapfill properties. Prior to the gapfill process, however, an initial lining layer 26, such as an in situ steam generation (ISSG) oxide or other thermal oxide layer or a silicon nitride layer, is usually formed.

In some applications trench 24 has an aspect ratio of between about 6:1 to 8:1 and the formation of a highly conformal film such as oxide liner 26 in trench 24 may increase the aspect ratio even further to, for example 10:1 or higher. Thus, the filling of trenches 24 is typically one of the most challenging gapfill applications in the formation of the integrated circuit.

One known method of depositing thin films, including thin film insulation layers, is referred to as atomic layer deposition or "ALD". ALD techniques have been known since the 1970's and have been investigated as a way of depositing a variety of materials including silicon oxide. Historically, an ALD process includes repetitively exposing a substrate to alternating flows of different gases, such as source and reactant gases, where a monolayer of the first gas is adsorbed on the surface of the substrate and the second gas reacts with the monolayer to form the desired material. In some instances the chamber is evacuated or purged between flows of the source and reactant gases to remove any excess gas and prevent gas phase reactions from occurring. For example, an ALD process used to form a layer of silicon oxide, includes exposing a substrate to a first silicon-containing gas so that an atomic layer of the silicon-containing gas is adsorbed on the substrate surface, evacuating the chamber to remove any excess silicon-containing gas and then exposing the substrate to an oxidizing agent that oxidizes the layer of silicon-containing material to form a solid thin film layer of silicon oxide. Each cycle of exposing the substrate to a silicon-containing gas followed by an oxidizing agent is then repeated multiple times until a desired film thickness is obtained.

As can be appreciated, such ALD techniques typically result in a very controlled, slow growth of material. Thus, within a semiconductor manufacturing context, ALD techniques have been typically used to form very thin films, e.g., gate oxides, where precise control over film thickness is more important than a high film deposition rate pulse gases, generally slow deposition, not used commercially for oxide gapfill applications.

Despite the efforts of these researches, however, to the best of the inventor's knowledge, no one has developed an ALD silicon oxide process to deposit relatively thick oxide layers such as those required in shallow trench isolation and other gapfill applications, suitable for commercial use.

BRIEF SUMMARY OF THE INVENTION

Embodiments of the present invention deposit an insulating material using atomic layer deposition (ALD) techniques. Some embodiments of the invention are particularly useful in filing narrow, high aspect ratio gaps formed between adjacent raised features, while other embodiments can be used to deposit blanket (non-gapfill) films. The techniques of the invention are useful for a variety of applications including, among others, the formation of premetal dielectric layers, intermetal dielectric layers and shallow trench isolation structures in integrated circuits. According to some embodiments of the invention, silicon oxide films can be deposited at a rate of 30 Å/cycle or more and can be used either alone or in conjunction with other deposition processes in a gapfill application.

According to one embodiment of the invention, a method of depositing a silica glass insulating film over a substrate is disclosed. The method exposes the substrate to a silicon-containing reactant introduced into a chamber in which the substrate is disposed such that one or more layers of the silicon-containing reactant are adsorbed onto the substrate; purges or evacuates the chamber of the silicon-containing reactant; converts the silicon-containing reactant into a silica glass insulating compound by exposing the substrate to oxygen radicals formed from a second reactant while biasing the substrate to promote a sputtering effect, and then repeats the exposing, purging/evacuating and exposing sequence a plurality of times until a desired film thickness is reached. In one embodiment, an average atomic mass of all atomic constituents in the second reactant is less than or equal to an average atomic mass of oxygen.

In another embodiment a method of depositing a silica glass insulating film over a substrate having a gap formed between two adjacent raised features, the gap having a bottom surface and a sidewall surface is disclosed. The method exposes the substrate to a silicon-containing reactant introduced into a chamber in which the substrate is disposed such that one or more layers of the silicon-containing reactant are adsorbed onto the substrate; purges or evacuates the chamber of the silicon-containing reactant; converts the silicon-containing reactant into a silica glass insulating compound by exposing the substrate to a plasma formed from a second reactant comprising oxygen atoms while biasing the substrate to promote a sputtering effect, wherein an average atomic mass of all atomic constituents in the second reactant is less than or equal to an average atomic mass of oxygen; and then repeats the exposing, purging/evacuating and exposing sequence multiple times. During growth of the silica glass film the substrate is maintained at a temperature between 300–800° C. during and the silica glass film grows up from the bottom surface of the gap at a rate greater than it grows inward on the sidewall surface of the gap.

These and other embodiments of the invention along with many of its advantages and features are described in more detail in conjunction with the text below and attached figures.

BRIEF DESCRIPTION OF THE DRAWINGS

FIG. 4 is a simplified, cross-sectional view of an exemplary substrate processing system in which the deposition processes associated with embodiments of the present invention may be carried out in.

DETAILED DESCRIPTION OF THE INVENTION

Embodiments of the invention pertain to a process for depositing a silica glass dielectric material using ALD techniques. Some embodiments of the invention permit the dielectric material to be deposited into closely-spaced gaps with substantially 100% gap fill for most currently envisioned small-width, high aspect ratio applications. For example, for gaps having a width of 0.10 microns substantially 100% gapfill can be achieved by embodiments of the invention for aspect ratios of 8:1 and even higher in both the active and open areas of an integrated circuit die. Other embodiments of the invention are particularly useful for depositing blanket silica glass films having a high density and exhibiting good stochiometry. Embodiments of the invention are useful for a variety of different applications and are particularly useful for the fabrication of integrated circuits having minimum feature sizes of 0.10 microns or less.

Figure 1:
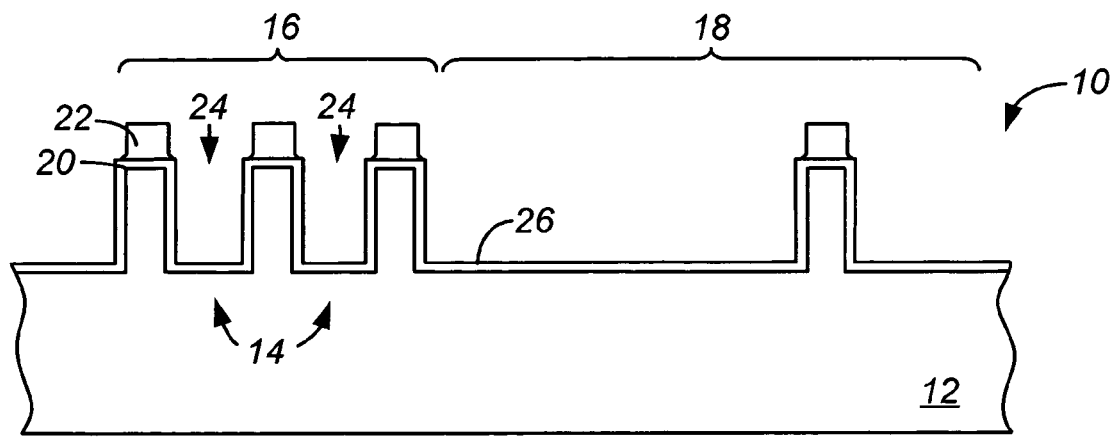
FIG. 1 is a simplified cross-sectional view of a partially completed integrated circuit that includes a plurality of shallow trench isolation structures.

In order to better appreciate and understand the present invention, reference is first made to FIG. 1, which is a flowchart depicting steps associated with one embodiment of the invention. The process discussed below with respect to FIG. 1 is for an undoped silica glass (USG) film that may be used, for example, in a shallow trench isolation (STI) application. It is to be understood, however, that the techniques of the present invention are applicable to the deposition of silica glass films for other applications including intermetal dielectric (IMD) layers, premetal dielectric (PMD) layers and others. Also, the techniques of the present invention are applicable to the deposition of a variety of silica glass materials, the use of which is application dependent, including phosphosilicate glass (PSG), boron-doped silicate glass (BSG), borophosphosilicate glass (BPGS), fluorine-doped silicate glass (FSG) and carbon-doped silicate glass (SiOC) among others.

Figure 2:
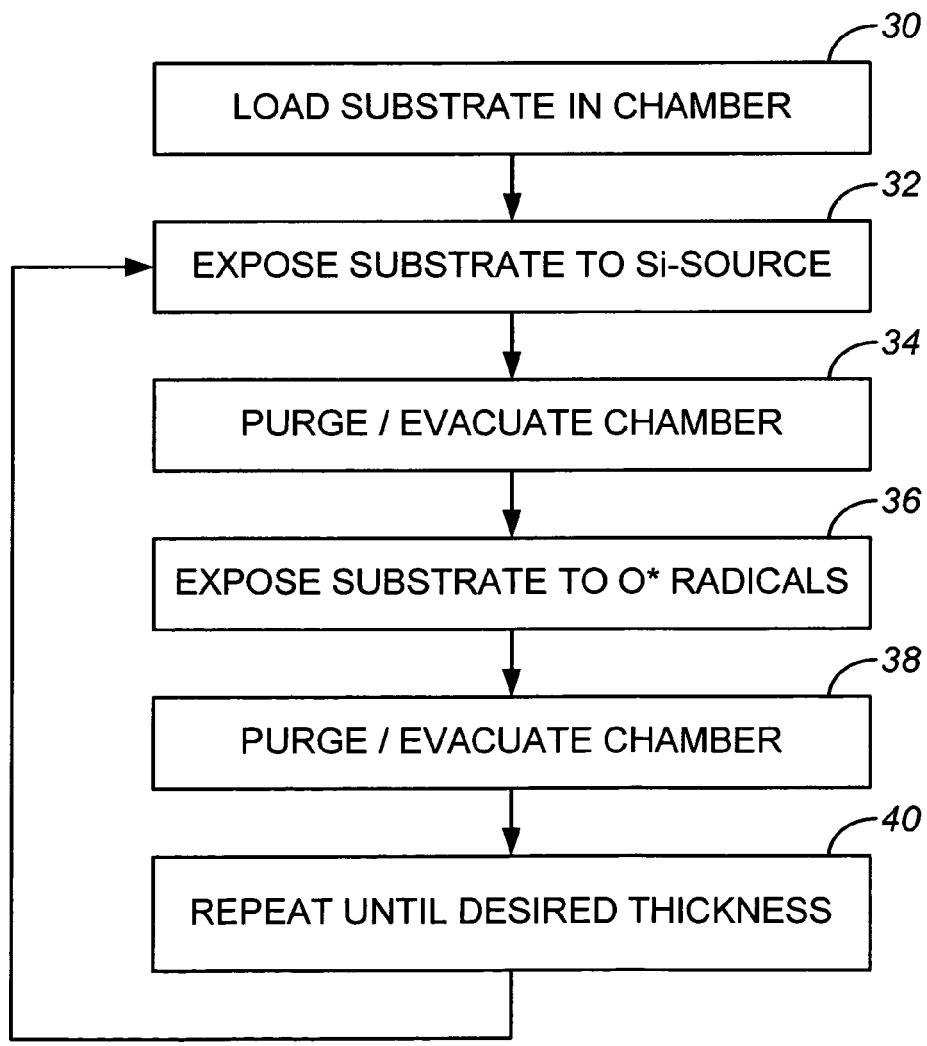
FIG. 2 is a flowchart depicting the steps associated with one embodiment of the present invention.

As shown in FIG. 2, the process starts by loading a substrate into an appropriate substrate processing chamber (step 30), such as the exemplary chamber discussed below with respect to FIG. 4. The substrate typically, but not necessarily, has one or more gaps formed between adjacent raised features. The raised features may be, for example, adjacent metal lines, transistor gates or other features. After the substrate is positioned in the chamber, an atomic layer deposition (ALD) process is initiated to deposit the silica glass layer. During the ALD process the substrate is alternatively exposed to a flow of a silicon source (step 32), such as silane, and reactive oxygen radicals (step 36) until a desired film thickness is reached (step 40).

In one particular embodiment during a first stage of the ALD process (step 32) the substrate is exposed to a brief flow of silane (e.g., 1–10 seconds) such that less than one or up to about 10 layers of silane molecules are adsorbed on the surface of substrate. Next, the silane flow is stopped in preparation for the second stage of the process in which the substrate is exposed to a second reactant that includes dissociated oxygen radicals (step 36).

During the second stage of the ALD process, the oxygen radicals react with the adsorbed silane to convert the silane molecules into a thin layer of silica glass. Byproducts from the reaction (e.g., $H_2O$ vapor) are pumped out of the chamber along with unreacted oxygen radicals. In some embodiments the oxygen radicals are formed by flowing molecular oxygen ($O_2$) or a similar oxygen source into the substrate processing chamber and forming a plasma therein, while in other embodiments the oxygen radicals are formed remote from the substrate processing chamber in, for example, a remote plasma source, and moved into the substrate processing chamber under a pressure difference between the remote plasma chamber and substrate processing chamber as is known to those of skill in the art.

It is desirable to fully oxidize the substrate surface during step 36 so that silicon-rich striations are not formed within the gapfill material. It is also desirable, however, to stop the reactive oxygen exposure step as soon as complete oxidation occurs in order to improve throughput of the process and save costs associated with excess gas. To this end, some embodiments of the invention employ an in situ monitor, such as an interferometer, in order to determine when full oxidation has occurred. The interferometer detects radiation reflected from the surface of the substrate and compares interference patterns to previous patterns that represent a fully oxidized film for the particular application. When it is determined full oxidation has occurred, the interferometer sends a signal that can be used to endpoint the second stage of the ALD process and initiate the next ALD cycle.

After the adsorbed silane molecules are converted to silicon oxide, the sequence of alternating flows of silane and oxygen radicals is then repeated multiple times until the silica glass layer reaches a desired thickness (step 40) as shown in FIG. 2.

Embodiments of the invention bias the oxygen radicals toward the substrate during the second stage in order to promote a sputter effect from the oxygen radicals simultaneous with the conversion of the silane molecules to silicon oxide. Such a bias can be provided, for example, by applying RF energy to a pedestal or other component that holds the substrate in the chamber. Generating sputtering simultaneous with oxide growth allows for anisotropic growth and control of the anisotropy by reducing sidewall growth. This, in turn, enables the ALD process to grow the silica glass layer in a bottom-up manner so that the growth of the layer proceeds faster on horizontal surfaces, such as the bottom of a trench, than on vertical surfaces, such as trench sidewalls. Applying bias power also results in a higher quality deposited film (e.g., higher density) and full oxidation (and complete doping in the case of doped films) in a shorter time than if no bias power was applied.

Some embodiments of the invention also add a flow of a light weight fluent gas, such as molecular hydrogen ($H_2$) or helium, to the second reactant in order to better control the reaction between the oxygen radicals and silane molecules and/or dilute the oxygen. In some embodiments the fluent includes a combination of molecular hydrogen and helium while in other embodiments it may hydrogen and/or helium mixed with include other gases, such as neon and/or argon. In some embodiments the gas introduced during step 36 does not significantly increase the amount of sputtering that is generated by the oxygen radicals. In such embodiments, the average atomic mass of all atomic constituents in the second reactant gas (the oxygen source gas and fluent gas) should be less than or equal to the average atomic mass of oxygen, which is approximately 16. In other embodiments the average atomic mass of the second reactant gas can be increased above that of oxygen by adding argon or another relatively heavy diluent gas to increase the sputter rate.

Also, some embodiments of the invention heat the substrate to a temperature above 300° C. during the ALD process (steps 32, 34, 36, 38, 40) while other embodiments of the invention heat the substrate to a temperature between about 300–800° C. during the process. The inventors have found that at such increased temperatures multiple layers of silane molecules are adsorbed onto the surface of the substrate during the first stage of the ALD process which can then be converted to multiple layers of silicon oxide during the second stage. This allows the ALD process to proceed at a considerably higher deposition rate than single layer ALD processes.

Some embodiments of the invention evacuate the ALD chamber between the first and second stages of the process (steps 32 and 36, respectively) by stopping the flow of all gases into the chamber and pumping out residual silane molecules that are not adsorbed onto the wafer surface with a vacuum pump. Similarly, some embodiments evacuate or purge the chamber of residual oxygen after the second stage in preparation for the first stage in the next ALD cycle.

Figure 3A:
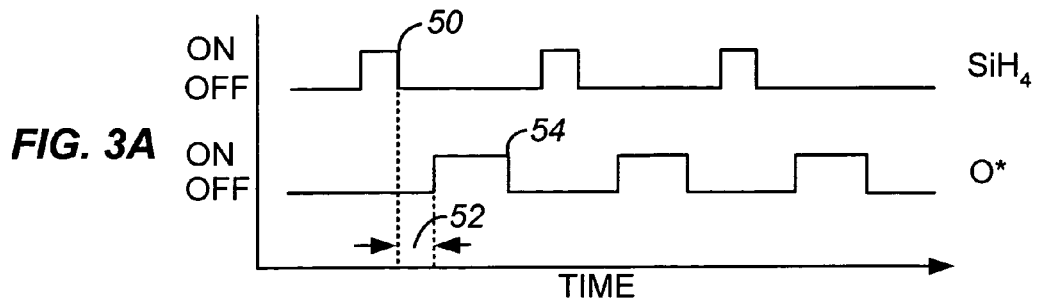
FIGS. 3A–3D are graphs depicting gas flow sequences employed during the ALD process set forth in FIG. 2 according to several different embodiments of the invention.

One example of such an embodiment is set forth in FIG. 3A which shows that after each pulse 50 of silane, no gas flow is introduced into the chamber for a time period represented by reference number 52 before the substrate is exposed to a pulse 54 of oxygen radicals.

Figure 3B:
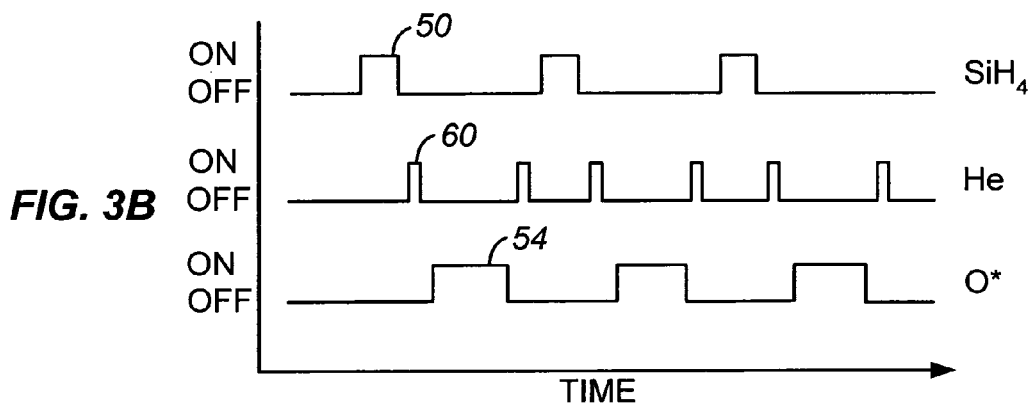
Figure 3C:
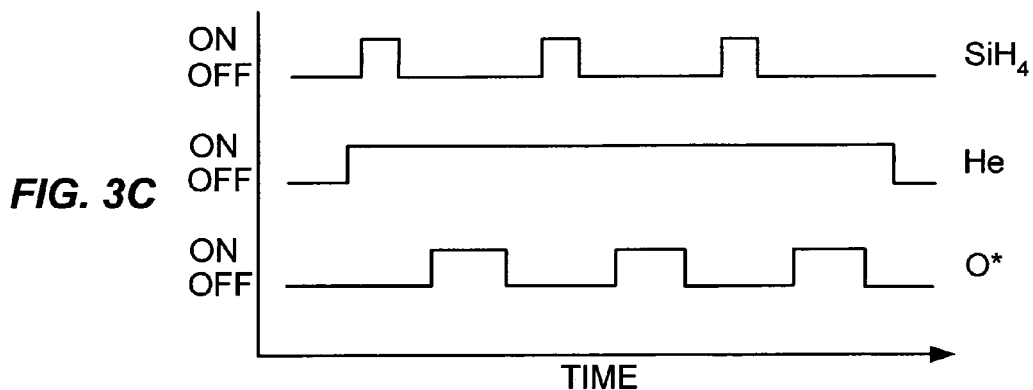

Other embodiments purge residual silane out of the chamber between the first and second stages by flowing a gas that is chemically inert to the silica glass forming reactants used in the first and second stages as shown in FIG. 3B. In FIG. 3B, a flow of helium 60 is introduced into the chamber after exposing the substrate to silane molecules (pulse 50) and prior to exposing the substrate to oxygen radicals (pulse 54). In other embodiments purge gases other than helium may be used including, for example, molecular hydrogen and/or argon among others. In still other embodiments, the silicon source can be purged by a flow of helium or another appropriate chemically inert gas that is maintained throughout the ALD sequence as shown in FIG. 3C.

Figure 3D:
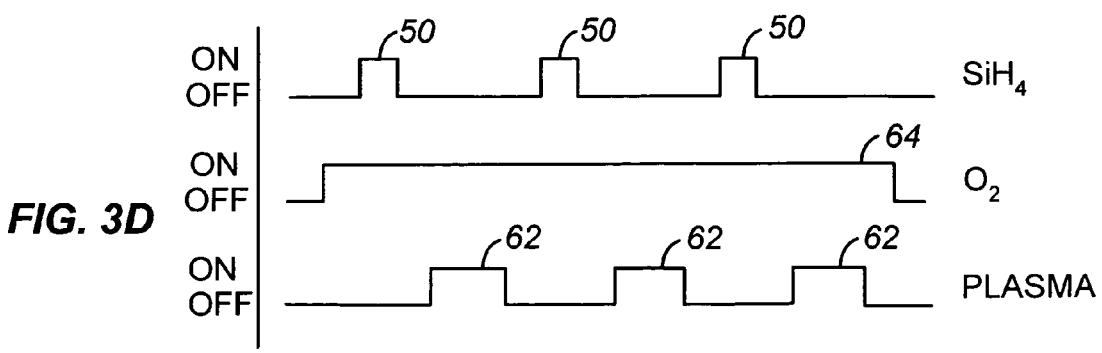

In still other embodiments, the silicon source is purged by a flow of oxygen that is maintained continuously during both the first and second stages of the ALD process as shown in FIG. 3D. In these embodiments, chamber conditions are kept such that the combination of silane and oxygen in the first stage do not react in the gas phase to produce an oxide film. Instead, the silane flow 50 is alternated with the application of energy 62 to form reactive radicals from the oxygen flow 64. During the stage where silane and oxygen are introduced into the chamber together without the dissociation of the gases, silane molecules are adsorbed onto the surface of the layer. Then, when silane flow is stopped the oxygen flow purges residual silane from the chamber. Afterwards, reactive oxygen radicals are formed from the flow of oxygen and the oxygen radicals convert the absorbed silane molecules to silicon oxide.

Figure 4:
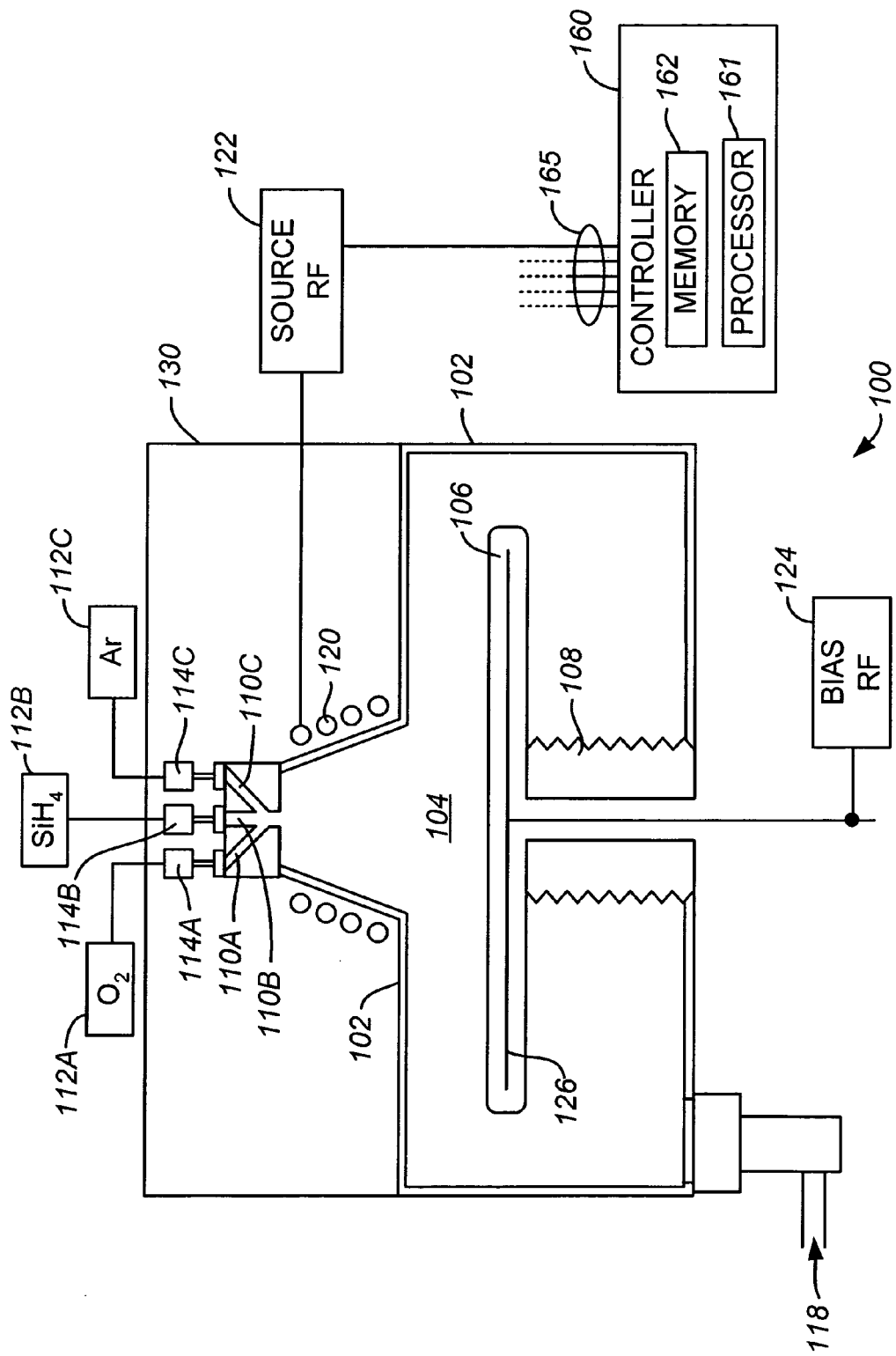

Exemplary ALD System:

FIG. 4 is a simplified cross-sectional view of one embodiment of an exemplary chamber 100 that can be used to perform the atomic layer deposition step in accordance with the present invention. Chamber 100 includes a primary chamber wall 102 that encloses a process area 104. A substrate pedestal 106 supports a substrate (not shown) within processing area 104 during ALD processing. Pedestal 106 can be raised and lowered within area 104 to a desired substrate processing position and bellows 108 prevent process gases from contacting the bottom portion of the pedestal.

Gases, such as $O_2$, $SiH_4$ and He (or another purge gas, diluent gas or sputtering agent) are introduced into processing area 104 through gas distribution channels 110a, 110b and 110c, respectively, from gaseous sources 112a, 112b and 112c, respectively. Switches 114a, 114b and 114c enable the pulse-like flow of gases into area 104 employed by ALD operations. In some embodiments of the invention, switches 114a–c are electrically or pneumatically operated. Gases introduced into area 104 from gas distribution channels 110a–c flow radially across the surface of the substrate positioned on substrate support 106 and out through the foreline 118 under the control of a vacuum pump (not shown). Also not shown are flow rate controllers coupled between each gas source and switch 114a–c that control the flow rate of the gases to the switch.

A narrow, upper portion of area 104 is surrounded by a coil 120. RF energy from RF power source 122 can be applied to coil 120 to form a plasma from gases introduced into this region of area 104. Dissociated species from the plasma are pumped along with the flow of gases through the chamber across the surface of the substrate. RF energy can also be applied to an electrode 126 within pedestal 106 from a bias RF power source 124 in order to promote a sputtering effect during selected stages of the ALD process. An RF shield 130 (e.g., grounded sheet metal) surrounds the upper portion of chamber 100 and coil 120.

In other embodiments, the ALD chamber may include a capacitively-coupled plasma system (e.g., a mixed frequency approach that may apply bias power to the substrate, the opposing surface or both) or other type of plasma formation system. Also, in other embodiments more or fewer gas sources 112a–c may be employed with each source having a corresponding MFC, switch and gas channel.

A system controller 160 controls the operation of both chamber 100 as well as other aspects of any multichamber system (e.g., a cluster tool) the chamber 100 may be part of. Such control is effected via connections to control lines 165 (which are only partially shown). Controller 160 controls, among other things, gas flow rates, RF power levels, gas pulses, pedestal spacing, chamber temperature and chamber pressure. Controller 160 may include, for example, a memory 162, such as a hard disk drive and/or a floppy disk drive and a card rack coupled to a processor 161. The card rack may contain a single-board computer (SBC), analog and digital input/output boards, interface boards and stepper motor controller boards. System controller 160 operates under the control of a computer program stored on the hard disk drive or through other computer programs, such as programs stored on a removable disk. The computer program dictates, for example, the timing, mixture of gases, RF power levels and other parameters of a particular process carried out in each chamber.

Table 1 below lists the process parameters that can be used in ALD silica glass deposition process (one cycle) according to one exemplary embodiment of the present invention. In the table, stage 1 is the first portion of the ALD cycle where silane is adsorbed on the surface of the substrate and stage 2 is the later part of the ALD cycle where the adsorbed silane is converted to silica glass. Additional steps can be included in the ALD cycle to add a dopant gas and/or to evacuate or purge the chamber of selected gases between the various ALD stages as discussed above.

TABLE 1

EXEMPLARY RANGES FOR ALD PROCESS PARAMETERS

| Parameter | Stage 1 Value | Stage 2 Value |
|---|---|---|
| RF Power | — | 10–1000 W |
| Bias Power | — | 10–1000 W |
| Pressure | 60–100 mTorr | 2–100 mTorr |
| Temperature | 300–800° C. | 300–800° C. |
| SiH$_4$ | 10–100 sccm | — |
| O$_2$ | 0–100 sccm | 10–100 sccm |
| He or H$_2$ | 0–100 sccm | 0–100 sccm |

The gas flow rates and RF values recited and described above are optimized for deposition processes executed in the exemplary chambers also described herein outfitted for 200 mm wafers. A person of ordinary skill in the art will recognize that these parameters and others are in part chamber specific and will vary if chambers of other design and or volume are employed.

Having fully described several embodiments of the present invention, many other equivalents or alternative embodiments of the present invention will be apparent to those skilled in the art. For example, while the invention described with respect to an undoped silicate glass layer, the invention can also be used to fill gaps with a variety of different insulating materials including, among others, of phosphosilicate glass (PSG), boron-doped silicate glass (BSG), borophosphosilicate glass (BPGS), fluorine-doped silica glass (FSG) and silicon oxynitride (SiON) by adding an appropriate dopant gas such as PH$_3$ for PSG, B$_2$H$_6$ for BSG, PH$_3$ and B$_2$H$_6$ for BPSG, SiF$_4$ for FSG or N$_2$O for SiON in one of the ALD cycles. A person of skill in the art can determine which ALD cycle the dopant should be added to (or whether is should be introduced in a separate, additional cycle) based on the compatability of the dopant and the first or second reactant. For example, in one embodiment PH$_3$ may be added with SiH$_4$ in step 32 to form a PSG film. In another embodiment, N$_2$O may be added with the oxidizer in step 36 to form an SiON film. Also, in some embodiments, an oxygen source such as N$_2$O or CO$_2$ can be used instead of O$_2$ and a silicon source other than monosilane may be used. Examples of suitable silicon sources include other silane family members such as, Si$_2$H$_6$, Si$_3$H$_8$, etc.; TEOS, SiCl$_4$ or SiF$_4$ among others although sources such as SiCl$_4$ and SiF$_4$ will result in lower deposition rates because they generally will not yield a multilayer deposition process as used in some embodiments of the invention.

Furthermore, while the invention was described primarily with respect to gapfill applications, embodiments of the invention are also useful in depositing blanket films. The techniques of the invention enhance film quality including film density and stochiometry among other factors and allow for complete oxidation of the film in less time than in ALD processes that do not use the sputtering techniques taught by the invention. As such, the above description is illustrative and not restrictive. These equivalents and/or alternatives are intended to be included within the scope of the present invention.

What is claimed is:

1. A method of depositing a silica glass insulating film over a substrate, the method comprising:
    exposing the substrate to a silicon-containing reactant introduced into a chamber in which the substrate is disposed such that one or more layers of the silicon-containing reactant are adsorbed onto the substrate;
    purging or evacuating the chamber of the silicon-containing reactant;
    converting the silicon-containing reactant into a silica glass insulating compound using primarily thermal energy to provide activation energy drive the deposition reaction by exposing the substrate to oxygen radicals formed from a second reactant while biasing the substrate to promote a sputtering effect; and
    repeating the exposing, purging/evacuating and exposing sequence a plurality of times.

2. A method of depositing a silica glass insulating film over a substrate, the method comprising:
    exposing the substrate to a silicon-containing reactant introduced into a chamber in which the substrate is disposed such that one or more layers of the silicon-containing reactant are adsorbed onto the substrate;
    purging or evacuating the chamber of the silicon-containing reactant;
    converting the silicon-containing reactant into a silica glass insulating compound by exposing the substrate to oxygen radicals formed from a second reactant while introducing a fluent gas into the chamber and biasing the substrate to promote a sputtering effect, wherein an average atomic mass of all atomic constituents introduced into the chamber during the converting step is less than or equal to an average atomic mass of oxygen; and
    repeating the exposing, purging/evacuating and exposing sequence a plurality of times.

3. The method of claim 1 wherein the silicon-containing reactant is a silane family member having a formula of Si$_n$H$_{2n+2}$.

4. The method of claim 3 wherein the second reactant consists of molecular oxygen (O$_2$).

5. The method of claim 1 wherein the second reactant consists of molecular oxygen (O$_2$) and a sputtering agent is introduce into the chamber along with the second reactant.

6. The method of claim 5 wherein the sputtering agent consists of molecular hydrogen (H$_2$).

7. The method of claim 5 wherein the sputtering agent comprises molecular hydrogen (H$_2$) and/or helium.

8. The method of claim 1 wherein the oxygen radicals are generated by forming a plasma within the chamber.

9. The method of claim 1 wherein the oxygen radicals are generated by forming a plasma in a remote plasma chamber.

10. The method of claim 1 wherein the chamber is evacuated of the silicon-containing reactant prior to exposing the substrate to oxygen radicals.

11. The method of claim 1 wherein the chamber is purged of the silicon-containing reactant by flowing a gas that is chemically inert to silica glass into the chamber.

12. The method of claim 1 wherein the chamber is purged of the silicon-containing reactant by flowing an oxygen source into the chamber.

13. The method of claim 8 wherein energy is applied to the chamber to form a plasma from the second reactant while biasing the substrate and wherein no plasma is formed while the substrate is exposed to the silicon-containing reactant.

14. The method of claim 1 further comprising doping the silica glass film with a dopant.

15. A method of depositing a silica glass insulating film over a substrate having a gap formed between two adjacent raised features, the gap having a bottom surface and a sidewall surface, the method comprising:
   exposing the substrate to a silicon-containing reactant introduced into a chamber in which the substrate is disposed such that one or more layers of the silicon-containing reactant are adsorbed onto the substrate;
   purging or evacuating the chamber of the silicon-containing reactant;
   converting the silicon-containing reactant into a silica glass insulating compound by exposing the substrate to a plasma formed from a second reactant comprising oxygen atoms while biasing the substrate to promote a sputtering effect, wherein an average atomic mass of all atomic constituents introduced into the chamber during the converting step is less than or equal to an average atomic mass of oxygen; and
   repeating the exposing, purging/evacuating and exposing sequence a plurality of times;
   wherein the substrate is maintained at a temperature between 300–800° C. during growth of the silica glass film and wherein the silica glass film grows up from the bottom surface of the gap at a rate greater than it grows inward on the sidewall surface of the gap.

16. The method of claim 1 further comprising monitoring an amount of oxidation that occurs during the converting step and stopping the converting step when a determination has been made that full oxidation has occurred.

17. The method of claim 16 wherein the monitoring step comprises detecting radiation reflected from the surface of the substrate, comparing interference patterns to previous patterns that represent a fully oxidized film and generating a signal that can be used to endpoint the converting step.

18. The method of claim 1 wherein multiple layers of the silicon-containing reactant are adsorbed onto the substrate surface during the step of exposing the substrate to the silicon-containing reactant.

19. The method of claim 2 further comprising monitoring an amount of oxidation that occurs during the converting step and stopping the converting step when a determination has been made that full oxidation has occurred.

20. The method of claim 19 wherein the monitoring step comprises detecting radiation reflected from the surface of the substrate, comparing interference patterns to previous patterns that represent a fully oxidized film and generating a signal that can be used to endpoint the converting step.

21. The method of claim 2 wherein the second reactant comprises molecular oxygen and the fluent gas is selected from the group consisting of helium, hydrogen and a combination thereof.

22. The method of claim 2 wherein multiple layers of the silicon-containing reactant are adsorbed onto the substrate surface during the step of exposing the substrate to the silicon-containing reactant.

23. The method of claim 15 further comprising monitoring an amount of oxidation that occurs during the converting step and stopping the converting step when a determination has been made that full oxidation has occurred.

24. The method of claim 23 wherein the monitoring step comprises detecting radiation reflected from the surface of the substrate, comparing interference patterns to previous patterns that represent a fully oxidized film and generating a signal that can be used to endpoint the converting step.

25. The method of claim 23 wherein multiple layers of the silicon-containing reactant are adsorbed onto the substrate surface during the step of exposing the substrate to the silicon-containing reactant.

26. The method of claim 15 wherein the second reactant comprises molecular oxygen and wherein a fluent gas selected from the group consisting of helium, hydrogen and a combination thereof is introduced into the chamber along with the second reactant.

27. The method of claim 1 wherein the substrate is maintained at a temperature of at least 300° C. during the growth of the silica glass film.

28. The method of claim 2 wherein the substrate is maintained at a temperature of at least 300° C. during the growth of the silica glass film.

* * * * *